US008618786B1

United States Patent
Perisetty et al.

(10) Patent No.: US 8,618,786 B1
(45) Date of Patent: Dec. 31, 2013

(54) SELF-BIASED VOLTAGE REGULATION CIRCUITRY FOR MEMORY

(75) Inventors: Srinivas Perisetty, Santa Clara, CA (US); Arvind Sherigar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 883 days.

(21) Appl. No.: 12/551,289

(22) Filed: Aug. 31, 2009

(51) Int. Cl.
*G05F 3/16* (2006.01)
*G11C 11/00* (2006.01)
*G11C 5/14* (2006.01)

(52) U.S. Cl.
USPC .................... 323/313; 365/154; 365/189.09

(58) Field of Classification Search
USPC .............. 323/313; 327/536; 365/189.09, 154
See application file for complete search history.

(56) References Cited

U.S. PATENT DOCUMENTS

| | | | |
|---|---|---|---|
| 4,533,863 A | 8/1985 | Luhn et al. | |
| 5,227,714 A | 7/1993 | Lou | |
| 5,510,699 A | 4/1996 | Theus et al. | |
| 5,795,069 A * | 8/1998 | Mattes et al. | 374/183 |
| 5,796,310 A * | 8/1998 | Ariyosi et al. | 330/307 |
| 6,147,908 A * | 11/2000 | Abugharbieh et al. | 365/185.2 |
| 6,150,798 A | 11/2000 | Ferry et al. | |
| 6,204,785 B1 * | 3/2001 | Fattaruso et al. | 341/120 |
| 6,414,549 B1 * | 7/2002 | Barbetta | 330/264 |
| 6,559,629 B1 * | 5/2003 | Fernald | 323/313 |
| 6,646,508 B1 * | 11/2003 | Barbetta | 330/264 |
| 6,750,683 B2 * | 6/2004 | McClure et al. | 327/78 |
| 7,023,262 B2 * | 4/2006 | Sim et al. | 327/541 |
| 7,145,318 B1 * | 12/2006 | Chan et al. | 323/316 |
| 7,330,049 B2 | 2/2008 | Perisetty | |
| 7,411,853 B2 * | 8/2008 | Liu et al. | 365/226 |
| 7,515,000 B1 * | 4/2009 | Jin et al. | 330/279 |
| 7,633,333 B2 * | 12/2009 | Ma | 327/539 |
| 7,948,792 B1 * | 5/2011 | Lee et al. | 365/154 |
| 2001/0004327 A1 * | 6/2001 | Dallabora et al. | 365/185.23 |
| 2004/0042304 A1 * | 3/2004 | Kirsch | 365/205 |
| 2004/0080987 A1 * | 4/2004 | Chen | 365/189.09 |
| 2005/0077923 A1 * | 4/2005 | Kim et al. | 327/50 |
| 2005/0104566 A1 * | 5/2005 | Kim | 323/226 |
| 2006/0279349 A1 * | 12/2006 | Grudin et al. | 327/334 |
| 2007/0109700 A1 * | 5/2007 | Shimogawa et al. | 361/57 |

OTHER PUBLICATIONS

Itoh et al, Ultra-Low Voltage Nano-Scale Memories (Integrated Circuits and Systems), Springer 2007, Chapter 6 Reference Voltage Generators, pp. 199-229.*

* cited by examiner

*Primary Examiner* — Adolf Berhane
*Assistant Examiner* — Emily P Pham
(74) *Attorney, Agent, or Firm* — Treyz Law Group; Jason Tsai (57) ABSTRACT

Integrated circuits with voltage regulation circuitry are provided. Voltage regulation circuitry may be powered by a core supply voltage and may not have a bandgap reference circuit. Voltage regulation circuitry may have an error amplifier in a negative feedback configuration. The error amplifier may have inputs connected to reference voltages generated by resistor strings. The resistor strings may be trimmable to provide a desired negative voltage. The desired negative voltage may be fed to the gates of transistors to help reduce leakage. The desired negative voltage may be have improved tolerance to process-voltage-temperature variations and may improve the reliability of transistors.

16 Claims, 6 Drawing Sheets

SELF-BIASED VOLTAGE REGULATION CIRCUITRY FOR MEMORY

BACKGROUND

This invention relates to voltage regulation circuitry, and more particularly, to voltage regulation circuitry that can provide an accurate regulated voltage without requiring external voltage reference sources.

Transistors on digital integrated circuits may behave like electrical switches that turn on or off depending on the voltages that are applied at their terminals. Many integrated circuits are based on n-channel metal-oxide-semiconductor (NMOS) transistors and p-channel metal-oxide-semiconductor (PMOS) transistors. An NMOS transistor is a four terminal device having a gate terminal, a drain terminal, a source terminal, and a body terminal.

The gate of an NMOS transistor can be driven to a logic high value (i.e., a positive power supply voltage) to turn the transistor on. When the transistor is on, current may flow from the drain to the source through the channel of the transistor. The channel of the NMOS transistor may be formed beneath the gate of the NMOS transistor. The gate of the NMOS transistor may be driven to ground (e.g., zero volts) to turn the device off. When the device is off, current may stop flowing. PMOS transistors may likewise be turned on and off by applying respective logic low and logic high values on their gates.

As transistors are reduced in size and as supply voltages are decreased with improvements in process technology, it may become difficult to ensure that transistors are fully switched off. For example, even when the gate of an NMOS transistor is grounded, a leakage current may still flow between the drain and the source. Leakage currents can pose problems in modern integrated circuit designs. For example, leakage currents may result in excess power dissipation, undesired discharging of dynamic voltages, robustness issues, and overall performance degradation. Leakage current is typically small in comparison to the normal current of a device that is on.

In certain integrated circuit applications, the presence of leakage may reduce manufacturing yield. In applications that require memory, for example, leakage effects may cause data to be read incorrectly from a memory array. For example, even if a memory cell within the memory array were storing a correct value (e.g., a logic value of "1"), an unsuccessful read operation would result in the reading out of an incorrect value (e.g., a logic value of "0"). The presence of unsuccessful reads from the memory array may render the die that the memory array is formed on defective, making it necessary to discard the die. It may be possible to reduce leakage by providing appropriate bias voltages to the transistors an integrated circuit. Care should be taken, however, to avoid undesirable cost and complexity in bias voltage sources on an integrated circuit. Care should also be taken to ensure that bias voltage sources perform satisfactorily despite changes in fabrication process conditions, operating voltage, and operating temperature (i.e., despite process-voltage-temperature or PVT variations).

It would therefore be desirable to be able to provide improved voltage regulation circuitry such as voltage regulation circuitry for supplying voltages that reduce transistor leakage currents.

SUMMARY

Integrated circuits may be provided with voltage regulation circuitry. The voltage regulation circuitry may produce a negative voltage. The negative voltage may be used to reduce leakage or may be used in other circuit applications. A self-biasing arrangement may be used to ensure that the voltage regulation circuitry is not difficult or costly to manufacture while exhibiting good immunity to process-voltage-temperature variations.

The voltage regulation circuitry may be used in any suitable integrated circuit. For example, the voltage regulation circuitry may be used in a programmable integrated circuit such as a programmable logic device integrated circuit. A programmable integrated circuit may have a configuration memory array that stores configuration data. Data may be stored in the configuration memory array to program and thereby customize programmable logic in the programmable integrated circuit. Data may be read from the memory array to confirm that the correct values have been written.

Integrated circuits with the voltage regulation circuitry may supply a regulated output voltage. For example, the voltage regulation circuitry may produce an output voltage less than 0 volts. The voltage regulation circuitry may receive a positive power supply voltage from external supply pins or an on-chip source and may receive a negative supply voltage from an internal charge pump or from external source. Based on these power supply voltages (e.g., the positive power supply voltage and the negative supply voltage), the voltage regulation circuitry may provide an accurate regulated voltage that can be fed to the configuration memory array to help reduce leakage. In other integrated circuits, the regulated voltage can be used in other circuit applications.

The voltage regulation circuitry need not include a bandgap reference circuit. Rather, the voltage regulation circuitry may be self-biased by forming a reference voltage source from the same power supply voltages that are used in producing the regulated output.

The voltage regulation circuitry may be implemented using an error amplifier in a negative feedback configuration. The voltage regulation circuitry may have a first resistor string (chain) and a second resistor string (chain). The first and second resistor strings may have matched (e.g., identical) configurations and resistor values. The error amplifier may have a first (positive) input and a second (negative) input connected to the second resistor string and the first resistor string, respectively. The first and second resistor strings may be trimmable to adjust the regulated voltage. The first and second resistor strings may be trimmed in the same way by a common trimming control circuitry. With one suitable arrangement, trimming functions may be implemented using a resistor string with an adjustable tap point. The location of the tap point may be adjusted by selectively blowing fuses that control associated control transistors (as an example).

The voltage regulation circuitry may exhibit inherent offset cancellation due to the matching of the first and second resistor strings. As a result, the regulated voltage may be stable over a relatively wide range of process, temperature, and voltage variations.

The regulated voltage may be applied to the terminals of transistors on an integrated circuit to help reduce leakage currents. For example, the regulated voltage may be negative and may be applied to the gates of address (access) transistors within the memory array. Address transistors may have very thin gate oxides with relatively small breakdown voltages. When controlling these transistors, control voltage magnitudes may be restricted so as not to overstress the address transistors. In particular, gate-to-source voltages may be maintained below the gate breakdown voltage. An accurate well defined voltage is helpful in preventing the inadvertent overstressing of the transistors. Reducing the leakage of address transistors may be desirable for more robust read operations. More robust read operations can help confirm that correct data has been written and may help increase the yield of the integrated circuit.

Further features of the voltage regulation circuitry, its nature and various advantages will be more apparent from the accompanying drawings and the following detailed description.

DETAILED DESCRIPTION

Integrated circuits often require the use of memory. For example, integrated circuits such as programmable integrated circuits (e.g., programmable logic device integrated circuits) may contain configuration memory arrays that store configuration data. The configuration data may be used to program custom logic for the programmable integrated circuits.

Voltage regulation circuitry may be provided on an integrated circuit. For example, voltage regulation circuitry may be used to accurately control a power supply voltage. The power supply voltage may be, for example, a negative voltage that is used in reducing leakage currents in memory array transistors (e.g., address transistors).

The use of voltage regulation circuitry to produce a negative output voltage that reduces leakage currents in programmable integrated circuit memory arrays is sometimes described herein as an example. This is, however, merely one illustrative use of the voltage regulation circuitry. The voltage regulation circuitry that is described herein may be used for any suitable integrated circuit application.

Figure 1:
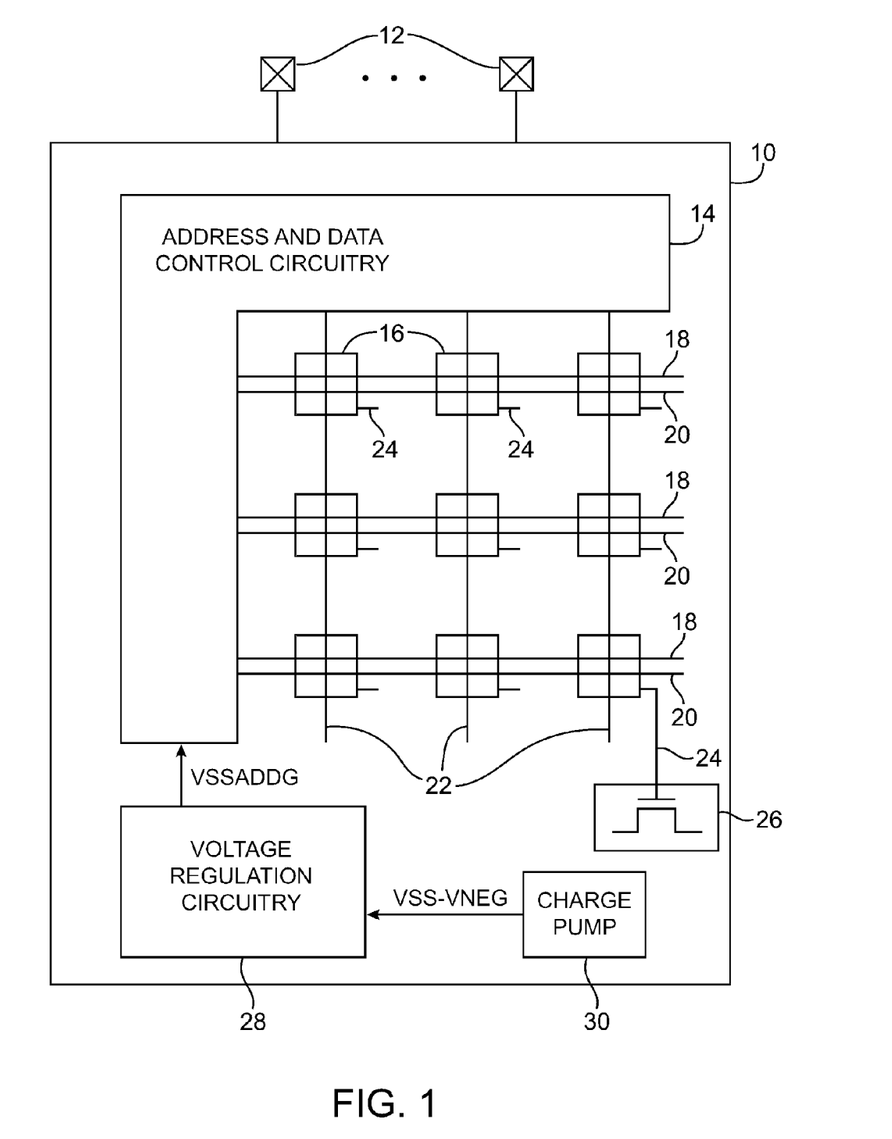
FIG. 1 is a diagram of an illustrative integrated circuit such as a programmable integrated circuit with a memory array and voltage regulation circuitry in accordance with an embodiment of the present invention.

An example of a programmable integrated circuit that includes a memory array is integrated circuit 10 of FIG. 1. As shown in FIG. 1, integrated circuit 10 may have pins 12 including data pins 12 and external power supply pins 12. Supply pins 12 may provide positive supply voltages (e.g., a main supply voltage VCC and a memory cell supply voltage VHIGH that is greater than VCC) and a ground reference (GND). Negative supply voltages may also be provided by pins 12 if desired. Supply pins 12 may be driven by an external power supply. Supply voltage signals that are brought in through supply pins 12 may travel through long traces and wires. These long traces and wires may have lengths that are considerably longer than the dimensions of integrated circuit 10. As a result, the supply voltages may suffer from power supply variation and noise from parasitic components (e.g., parasitic inductances, capacitances, and resistances from the print circuit board on which the traces are formed).

Integrated circuit 10 may include address and data control circuitry 14 that controls a memory array of memory cells 16. Control circuitry 14 may have decoders used to address the different rows and columns of the memory array, registers that contain data to be written into the memory array, precharge and sense circuitry for reading, write driver circuitry for writing, and other circuitry that facilitates operation of the memory array. Control circuitry 14 may assert address signals on address lines 18 to enable a certain row for reading or writing. Control circuitry 14 may provide clear lines 20 used for clearing the memory array (e.g., upon power up). Control circuitry 14 is coupled to data lines 22 that can be used during read and write operations.

The memory array includes an array of memory cells 16 arranged in rows and columns. To select a specific memory cell 16 in the memory array, the corresponding address line 18 (e.g., row signal) and data line 22 (e.g., column signal) may be asserted (e.g., by applying a voltage with a logic level of "1" to these lines). For example, to read from a certain memory cell 16, the address line 18 in the corresponding row and the data line 22 in the corresponding column may be asserted. Depending on the value stored in the memory cell, the voltage on the data line may remain charged or may be discharged. More than one data line 22 may be used for each column of memory cells if desired for multi-port read out. When one address line 18 is asserted, the address lines 18 on all the other rows should be disabled (e.g., have a logic value of "0"). When one address line 18 is asserted, a group of adjacent data lines 22 may be used to convey data to or from the array (e.g., if it is desired to read out multiple data bits on the group of adjacent data lines).

Each memory cell 16 may have a storage node 24 that provides a static control signal. The static control signal may be fed to the gate of a programmable logic component such as pass transistor 26. Pass transistor 26 may be a part of a programmable logic block that is used to implement a logic function that is part of a user's custom logic design. Logic functions that can be implemented in this way may be as simple as an AND function or as complicated as a control logic for a detailed state machine. The static control signal that is produced by each memory cell may remain unchanged during normal operation of integrated circuit 10.

Control circuitry 14 may receive a regulated voltage VSSADDG (see, FIG. 1) from voltage regulation circuitry 28. Voltage regulation circuitry 28 may receive negative supply voltage VSS_VNEG from an on-chip charge pump 30. The use of charge pump 30 may eliminate or reduce the need for supplying negative voltage VSS_VNEG from an external source. If desired, however, VSS_VNEG may be supplied from an external source using one of pins 12.

Capacitors (e.g., shunt capacitors) of different capacitances can be used in charge pump 30 to eliminate noise at a wide range of frequencies. Charge pump 30 may be fabricated physically close to the voltage regulation circuitry 28 to ensure that the path connecting the charge pump to the voltage regulation circuitry is relatively short. This may help minimize potential parasitic noise sources such as sources that influence VSS_VNEG through capacitive coupling.

Figure 2:
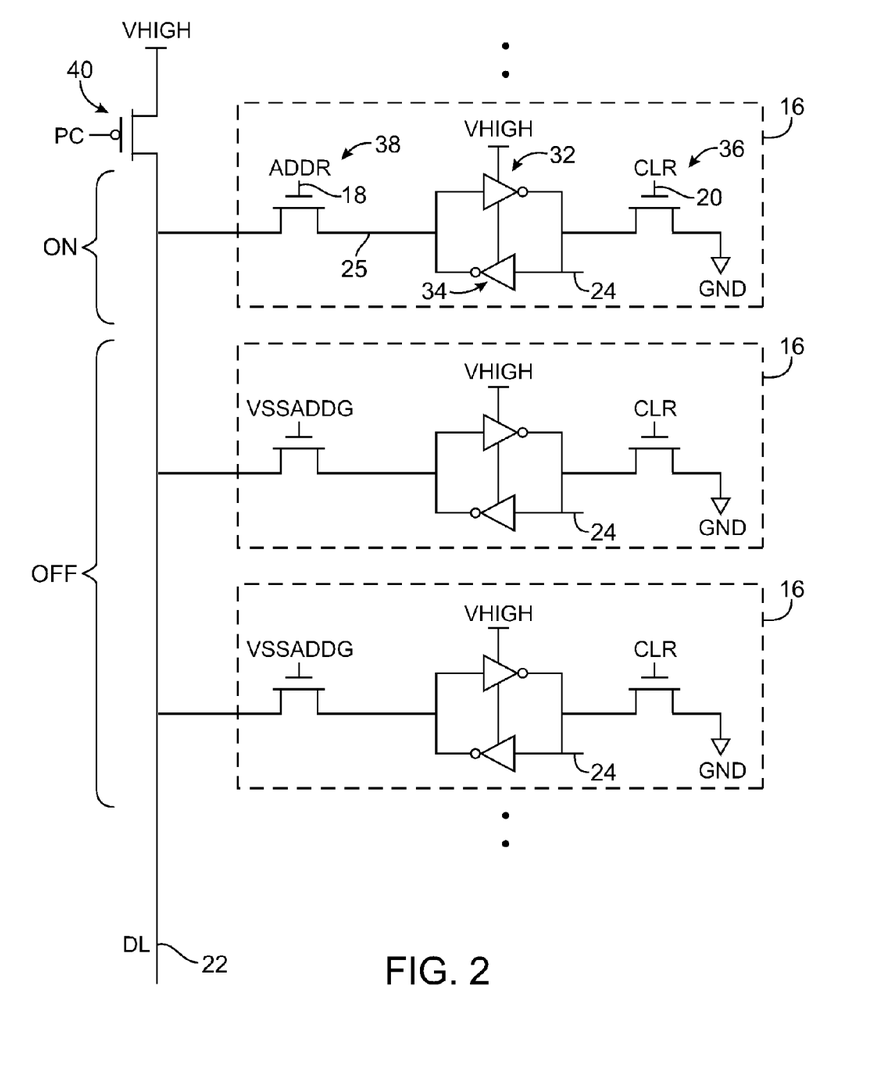
FIG. 2 is a schematic diagram of an illustrative column of memory cells connected to a data line in an integrated circuit of the type shown in FIG. 1 in accordance with an embodiment of the present invention.

Regulated voltage VSSADDG may be used in reducing leakage currents in the memory array of circuit 10. An illustrative column of memory cells 16 within the memory array is shown in FIG. 2. As shown in FIG. 2, a given column (or row if the orientation of the array is rotated) may have multiple memory cells 16 arranged in a vertical configuration (e.g., each memory cell is stacked on top of its neighbor). Each memory cell 16 may have an address transistor 38, a clear transistor 36, and a pair of cross-coupled inverters (e.g., inverters 32 and 34, where the output of inverter 32 is connected to the input of inverter 34 and the output of inverter 34 is connected to the input of inverter 32).

Inverters 32 and 34 may each be formed from re-channel metal-oxide-semiconductor (NMOS) transistors and p-channel metal-oxide-semiconductor (PMOS) transistors. Inverters 32 and 34 may be powered by positive memory cell power supply voltage VHIGH. Voltage VHIGH may be generated using an on-chip voltage regulator or may be received through supply pins 12. In this illustrative example, VHIGH may be equal to 1.5 volts (V). Because storage nodes 24 and 25 are driven by the outputs of inverter 32 and 34 respectively, storage nodes 24 and 25 may be pulled up to as high as 1.5V. Storage nodes 24 and 25 may have inverted values (e.g., if storage node 24 has a logic value of "1," storage node 25 may have a logic value of "0" and vice versa). The pair of cross-coupled inverters 32 and 34 form a bistable data storage element and may sometimes be referred to as a latch.

The drain of clear transistor 36 may be connected to storage node 24. The source of clear transistor 36 may be grounded. The terminology of drain and source may be used interchangeably in a transistor, so the term source-drain is sometimes used to refer to both a source and a drain. Clear transistor 36 may be an NMOS transistor. If desired, clear line 20 may be enabled to hold storage node 24 at ground (e.g., forcing storage node 24 to hold a value of "0" and storage node 25 to store a value of "1"). The entire memory array may be cleared by enabling all the clear lines during a power-on-reset phase of integrated circuit 10. More than one clear transistor 36 may be used in each memory cell 16. Memory array may be cleared so that all memory cells hold a logic value of "1" or so that all memory cells hold a logic "0" value. If desired, a PMOS transistor with a source driven to VHIGH may be used as the clear transistor. Clear transistors may also be omitted from the array.

While clear transistor 36 is used for clearing, address transistor 38 is used for accessing the memory cell (i.e., to perform reading and writing operations on memory cell 16). The drain of address transistor 38 may be connected to data line 22. The source of address transistor 38 may be connected to storage node 25. As illustrated in the example of FIG. 2, address transistor 38 may be an NMOS transistor.

In a write operation, data line 22 may be driven to a desired value by a write driver in circuit 14 (FIG. 1). In a scenario in which the write driver pulls the data line down towards ground, a logic value of "0" will be written into storage node 25, resulting in a logic value of "1" being stored at storage node 24. The write driver may be strong enough to overpower the PMOS transistor of inverter 34 to flip storage node 25 from "1" to "0." In another scenario in which the write driver pulls the data line up towards VHIGH, a logic value of "1" will be written into storage node 25 (e.g., resulting in a logic value of "0" being stored at storage node 24). The write driver may be strong enough to overpower the NMOS transistor of inverter 34 to flip storage node 25 from "0" to "1". This way of writing into memory cell 16 through one address transistor is said to use a single-ended write scheme. If desired, an additional address transistor may be connected to node 24 to implement a differential write scheme. An additional data line 22 may be coupled to the additional address transistor. For example, a first write driver on a first data line may aim to write a "0" into storage node 25 while a second write driver on a second data line may aim to write a "1" into storage node 24.

In a read operation, data line 22 may be precharged to memory cell supply voltage VHIGH by transistor 40. Transistor 40 may be a PMOS transistor. Before enabling address line 18, control signal PC (see, FIG. 2) may be grounded to precharge data line 22 to the memory cell supply voltage. Upon enabling address line 18, if storage node 25 is holding a "1," data line 22 will remain at "1." This is because there is no direct path to ground, indicating that a "0" (e.g., the value that corresponds to storage node 24) is being read out. For this to occur, transistor 40 must be sufficiently strong to keep data line 22 at "1."

If storage node 25 is holding a "0," then data line 22 may discharge through address transistor 18 and the NMOS transistor in inverter 34. It may be desirable for data line 22 to start discharging towards ground to reflect the "0" stored at storage node 25. For this to occur, transistor 40 must be sufficiently weak to allow the enabled address transistor 38 to discharge data line 22. Thus, transistor 40 should be a weak pull-up device that is sufficiently strong to maintain a "1" on line 22 when storage node 25 is storing a "1". This way of reading from memory cell 16 through one address transistor is said to use a single-ended read scheme. The single-ended read scheme may be more susceptible to noise in comparison to a differential read scheme. The differential read scheme requires at least two address transistors 32 in each memory cell 16, where a first address transistor is connected to storage node 24 and a second address transistor is connected to storage node 25. The first and second address transistors are connected to a first and second data line respectively. The first and second data line may be precharged to memory cell supply voltage VHIGH. Upon enabling the address line of the first and second address transistor (e.g., a common address line shared by the gates of the first and second address transistors), one of the data lines may discharge faster than the other. A sense circuitry may examine the voltages of the first and second data lines and produce a read out result based on the difference of the voltages of the first and second data lines. The differential read scheme may allow noise to be canceled out since noise may be common to both data lines and may be effectively canceled out from the perspective of the sense circuitry. Any other suitable read scheme may be used, if desired.

Transistor 40 may be designed to function correctly in ideal conditions in which no leakage is present. In a read operation, only the address line of one specific memory cell 16 should be enabled. All the other address lines 18 may be grounded. Short channel devices such as many NMOS transistors may exhibit leakage even when their gates are grounded. As a result, transistor 40 may not be able to hold data line at "1" in the presence of leakage from all the other address transistors that should be off. For example, a memory cell 16 may be enabled and may have a "1" stored at storage node 25, so it is desirable for the precharged data line to stay at "1." In a worst case scenario, storage nodes 25 of all the other memory cells may be storing a "0," which may collectively provide enough leakage current to discharge data line erroneously down towards ground, resulting in a faulty read.

One way to mitigate this effect is to reduce the number of memory cells 16 on each data line 22 with a corresponding loss in storage capacity. If there are fewer memory cells on each data line, the leakage contribution of all of the disabled address transistors would directly be reduced. It may, however, be desired to use as many memory cells as possible on each data line to maximize the storage capacity of the memory array. In this type of situation, the need to reduce the number of memory cells on each data line can be eliminated or reduced by driving the disabled address lines 18 to a voltage that is below ground. Driving the address transistors 38 in this way may decrease leakage substantially and may thereby allow more memory cells to be placed on a given data line 22.

The voltage used to reduce leakage may be a regulated voltage VSSADDG that may be negative (see, e.g., FIG. 2). Voltage VSSADDG may be fed to the gates of the disabled address transistors 38 that should be in the off mode during a normal read operation. Voltage VSSADDG may be driven to −0.15V in the example shown in connection with this present invention. Other values (e.g., negative values of −0.1 volts to −0.25 volts or other negative voltages) may also be used. The use particular voltage values in the voltage regulator circuitry of device 10 is merely illustrative.

In a scenario in which a corresponding memory cell has a "1" stored at storage node 25 (e.g., storage node 25 is driven to 1.5V because memory cell supply voltage VHIGH is 1.5V), the magnitude of the gate-to-source voltage (VGS) may be 1.65V (e.g., the source voltage of 1.5V minus the gate voltage of −0.15V). A gate-to-source voltage of 1.65V may be just under the maximum allowable gate-to-source voltage for address transistor 38. All transistors used in memory cell 16 may have thin gate oxides with a relatively low gate oxide breakdown voltage. To ensure reliable operation, a maximum value of 1.65 volts may be imposed (as an example). If there were variation in VSSADDG, the gate-to-source voltage of the address transistor may increase beyond 1.65V (i.e., to a value of 1.66 volts), resulting in possible gate oxide breakdown and other undesirable reliability issues. It may therefore be desirable to provide an accurate and stable value of VSSADDG at the output of voltage regulation circuitry 28. This value may be constant over a range of process, voltage, and temperature variations so that the magnitude of the gate-to-source voltage of the address transistor remains well controlled at 1.65V.

Voltage VSSADDG may be provided by voltage regulation circuitry 28 (FIG. 1). Conventional voltage regulation circuitry often includes a bandgap reference circuit. The bandgap reference circuit in conventional circuits is used provide a reference voltage that is fed to an input of an operational amplifier. The operational amplifier is typically part of a feedback circuit. The bandgap reference circuit and the feedback circuit may be used in conjunction with each other to provide a regulated output voltage. Although voltage regulator circuits with bandgap reference circuits may be acceptable in some applications, bandgap circuits are relatively complex and therefore may consume a relatively large amount of circuit resources. The bandgap reference and feedback circuit in this type of conventional voltage regulator may also be influenced by different error sources. As a result, errors (offset voltages) for the bandgap reference circuit and the feedback circuit may be cumulative, making accurate output voltages difficult or impossible to produce.

Simultaneous trimming of the bandgap reference circuit and the feedback circuit may be used to mitigate the effects of these errors. However, the need to trim both the bandgap reference circuit and the feedback circuit may introduce undesirable cost and complexity. It would therefore be desirable to be able to provide a circuit that can produce an accurate regulated voltage without the use of a bandgap reference circuit.

Figure 3:
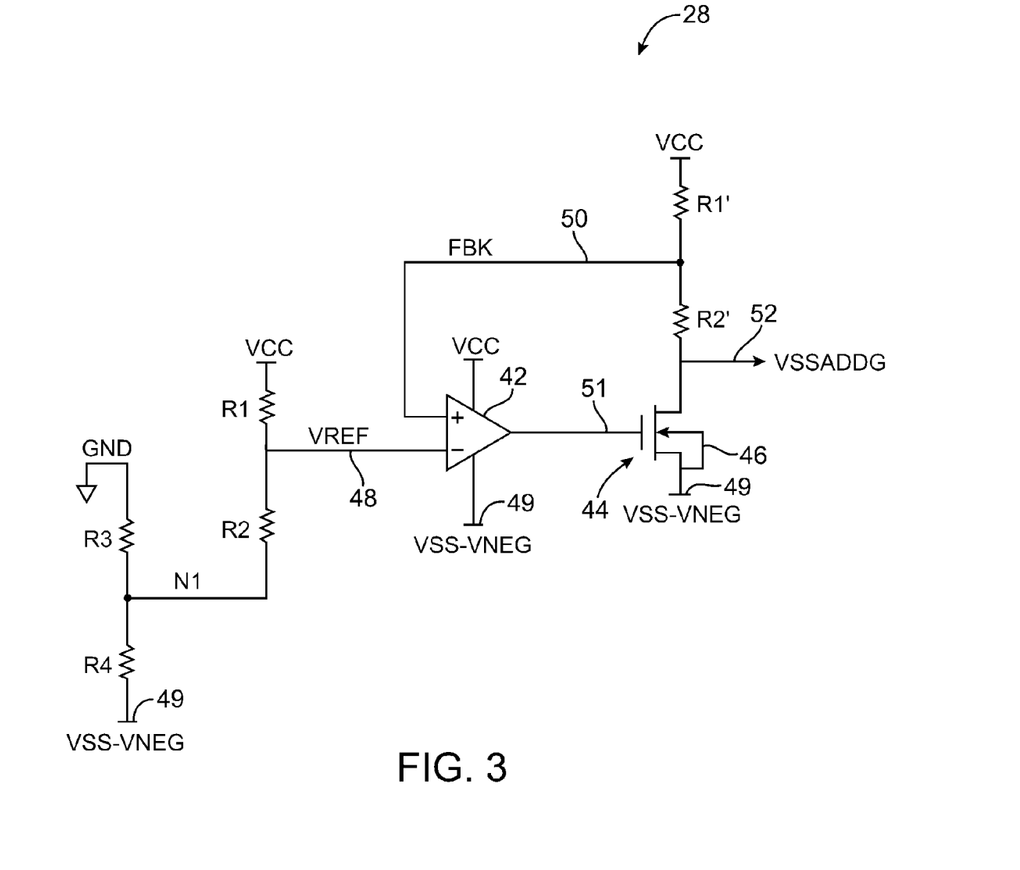
FIG. 3 is a schematic diagram of voltage regulation circuitry of the type that may be used in an integrated circuit such as the integrated circuit of FIG. 1 in accordance with an embodiment of the present invention.

FIG. 3 shows voltage regulation circuitry 28 that can be used to provide an accurate regulated voltage without the use of a bandgap reference circuit. Voltage regulation circuitry 28 may provide regulated voltage VSSADDG that can be used to disable the gates of address transistors 38 to reduce leakage. Circuitry 28 uses resistor strings to generate reference voltages. The resistor strings may include resistors connected in series. Using this approach, errors in the reference voltage circuit and the feedback circuit portions of the voltage regulation circuitry tend to cancel (i.e., the circuit is "self-biased"), thereby enhancing output voltage accuracy.

As shown in FIG. 3, resistor R3 may connect a ground node GND to node N1. Resistor R4 may connect node N1 to node 49. Node 49 may be driven by charge pump 30 (e.g., a charge pump that produces voltage level VSS_VNEG). Voltage VSS_VNEG may be −0.5V as an example. Because resistors R3 and R4 are connected in series, node N1 may have a voltage that is between ground and VSS_VNEG (e.g., depending on the resistive division between R3 and R4). As an example, the voltage at N1 may be −0.15V. The ratio of the resistance of resistor R3 to R4 may be equal to 3 to 7. The resistances of resistors R3 and R4 may have suitable values that can produce −0.15V at node N1 (in this example).

Resistor R1 may connect a positive power supply voltage node to node 48. The positive power supply voltage node may be powered at the supply voltage VCC (e.g., from an on-chip regulator that is fed by supply pins 12 or directly from one of pins 12). Voltage VCC may be the normal positive power supply voltage for powering the main logic on integrated circuit 10.

Resistor R2 may connect node 48 to node N1. Because resistor R1 and R2 are connected in series, node 48 may have a voltage that is between VCC and −0.15V. It may be desired to bias node 48 at 0.5V for example. The voltage VREF that is produced at node 48 may serve as a reference voltage for error amplifier 42 and may be provided to one of the inputs of error amplifier 42 (e.g., the negative input of error amplifier 42).

Error amplifier 42 may be powered by positive supply voltage VCC and negative supply voltage VSS_VNEG (via line 49). Amplifier 42 may have a positive input connect to feedback node (path) 50. Feedback node 50 may have a feedback voltage FBK. Error amplifier 42 subtracts the voltage level at its negative input from the voltage level at its positive input to determine an error voltage. Error amplifier 42 may amplify the error voltage by a gain factor (AV1) and may produce a corresponding output voltage on amplifier output node 51. Gain factor AV1 may be any value larger than one. Error amplifier 42 may be an operational amplifier or any amplifier that provides suitable gain. Amplifier 42 may be implemented using a single stage or multi-stage configuration.

Resistor R1' may connect the power supply voltage node VCC to feedback node 50. Resistor R2' may connect feedback node 50 to node 52. Node 52 may serve as an output for circuitry 28 and may provide a voltage VSSADDG that is negative and well regulated. The voltage VSSADDG on output path 52 may be fed to address and data control circuitry 14 of FIG. 1 to use in reducing leakage currents in address transistors 38 during memory operations.

Node 52 may be connected to the drain of control transistor 44. Transistor 44 may be an NMOS transistor. The configuration of circuitry 28 may be modified (e.g., mirrored horizontally) if a PMOS transistor were to be used as transistor 44. Transistor 44 may have a gate connected to node 51. Node 51 serves as the output of error amplifier 42 and provides a control signal to transistor 44 that regulates the value of VSSADDG.

Transistor 44 may have a source connected to node 49. Node 49 may have a voltage value of VSS_VNEG. Transistor 44 may have a body terminal 46 that is shorted to its source. Body terminal 46 may be connected to ground if desired. Connecting the body terminal to ground may alter the threshold voltage of transistor 44 due to a mechanism known as back-biasing. Transistor 44 is arranged in a common-source configuration (e.g., the source of transistor 44 is tied to a relatively constant supply voltage). Transistor 44 is used in conjunction with a load (i.e., resistor R2' and any additional capacitance at node 52) to provide a voltage gain of AV2.

Voltage regulation circuitry 28 may have a negative feedback configuration. In nominal operating conditions, the voltages at the positive and negative inputs of error amplifier 42 are equivalent (e.g., at 0.5 V for example). Noise may cause the voltage level at node 50 to slightly increase beyond the nominal voltage level (e.g., 0.51V if noise were to contribute a 10 mV error). Because the voltage at the positive input increased slightly, a positive error voltage is developed at the inputs of error amplifier 42. This error voltage translates to an increase in voltage at node 51 due to gain AV1 of error amplifier 42. Node 51 is connected to the gate of transistor 44. An increase in voltage at the gate of transistor 44 (e.g., an NMOS transistor) translates to an increase in the gate-to-source voltage VGS. A higher gate-to-source voltage tends to increase the current flowing through transistor 44. The current that flows through transistor 44 also flows through resistor R1'. An increase in current through R1' produces a larger voltage drop across resistor R1' that forces feedback node 50 back down towards the nominal voltage level of 0.5V. This action of self adjusting the error voltage back down to zero is known as negative feedback.

Figure 4:
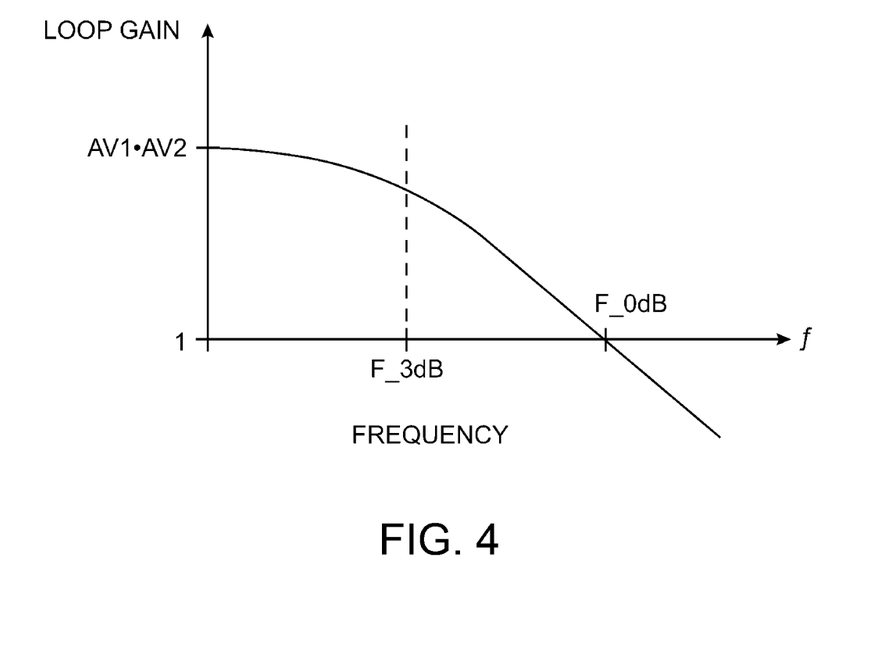
FIG. 4 is an illustrative Bode plot showing loop gain versus frequency for voltage regulation circuitry in accordance with an embodiment of the present invention.

The feedback configuration of circuitry 28 can be characterized by a Bode plot of the type shown in FIG. 4. The Bode plot portrays the magnitude of loop gain versus frequency. The loop gain corresponds to the gain provided by the complete feedback loop (e.g., from node 50 to node 51 to node 52). At low frequencies, the loop gain may be equal to the gain of the error amplifier 42 (AV1) multiplied by the gain of transistor 44 (AV2) to provide a low frequency gain of AV1*AV2. As frequency increases, the loop gain may stay constant up to a break point known as the 3 decibel (dB) point (F_3 dB). The 3 dB point corresponds to a 3 dB drop in loop gain from the low frequency gain. After F_3 dB, the loop gain may continue to drop as frequency increases. At a unity gain frequency (F_0 dB), the loop gain is equal to (e.g., magnitude of 1 corresponds to 0 dB). The loop gain may be less than 1 for frequencies higher than F_0 dB. This type of loop gain where gain exists at low frequencies and where gain is attenuated at higher frequencies is said to exhibit a low-pass characteristic.

Noise may be present at node 49. In the presence of noise at node 49, voltage VSS_VNEG may vary. If the frequency of the noise variation at node 49 is low (e.g., lower than the break point F_3 dB), the feedback arrangement of voltage regulation circuitry 28 may have sufficient loop gain to self correct for the variation and may maintain node 52 at the desired VSSADDG of −0.15 V. For example, if noise contributed a 10 mV variation in VSS_VNEG and the frequency of the noise is low, there may be less than 1 mV variation in VSSADDG which may be acceptable.

If the frequency of variation at node 49 is high (e.g., higher than the unity gain frequency F_0 dB), the feedback arrangement of circuitry 28 may not have sufficient loop gain to self correct for the variation. In this scenario, node N1 may vary and not be stable enough at the desired voltage level of −0.15 V. For example, if noise contributed a 10 mV variation in VSS_VNEG and the frequency of the noise is high, there may be a 10 mV variation in VSSADDG which might be unacceptable in some applications.

Because node N1 is coupled to node 49 by resistor R4, variation in VSS_VNEG may cause voltage fluctuations at node N1. Variation and inaccuracy at node N1 may directly impact the accuracy of voltage VSSADDG produced at node 52. One way to mitigate the impact of voltage variation on node N1 is to decrease the resistance of resistor R1. Another way to decrease the impact of variation at node 49 is to increase the resistance of resistor R2.

For example, if node 49 were to experience a variation of 0.1V from the nominal voltage of −0.5 V and if resistors R3 and R4 have resistances of 3 and 7 kilo-ohms respectively, node N1 would suffer a variation of 0.07 V, which may directly induce an undesirable variation of 0.07V on node 52. One way to reduce this variation would be to increase the resistance of resistor R4. If node 49 were to experience a variation of 0.1 V from the nominal voltage of −0.5 V and if resistors R3 and R4 have resistance of 3 and 10 kilo-ohms respectively, node N1 would only suffer a variation of less than 0.03 V (compared to the variation of 0.07 V in the original configuration). This effect can also be achieved by decreasing the resistance of resistor R3. A drawback to this approach is that changing the resistances of R3 and R4 may shift the voltage at node N1 to a value that is not equal to the desired level of −0.15V. There may therefore be a tradeoff between minimizing variation at node N1 and generating the desired voltage value of −0.15 V at node N1.

It is also possible to directly reduce the variation at node 49. Voltage VSS_VNEG may not necessarily be provided through external supply pins 12. Node 49 may instead by connected to charge pump 30. Charge pump 30 may be on-chip (e.g., as part of the same integrated circuit 10 on which regulation circuitry 28 is fabricated). Charge pump 30 may produce a relatively stable voltage VSS_VNEG at −0.5 V so that adjustments to the values of resistor and R3 and R4 from the nominal values of 3 and 7 kilo-ohms may not be necessary.

Resistors R1 and R2 form a first resistor string. Resistors R1' and R2' form a second resistor string. The resistance of resistor R1 may match and therefore track (e.g., follow in response to PVT variations) the resistance of resistor R1', and the resistance of resistor R2 may match and therefore track the resistance of resistor R2'. The combined resistances of the series-connected resistors in the first resistor string may therefore match and track the resistances of the series-connected resistors in the second resistor string to ensure that node 52 tracks node N1.

Figure 5:
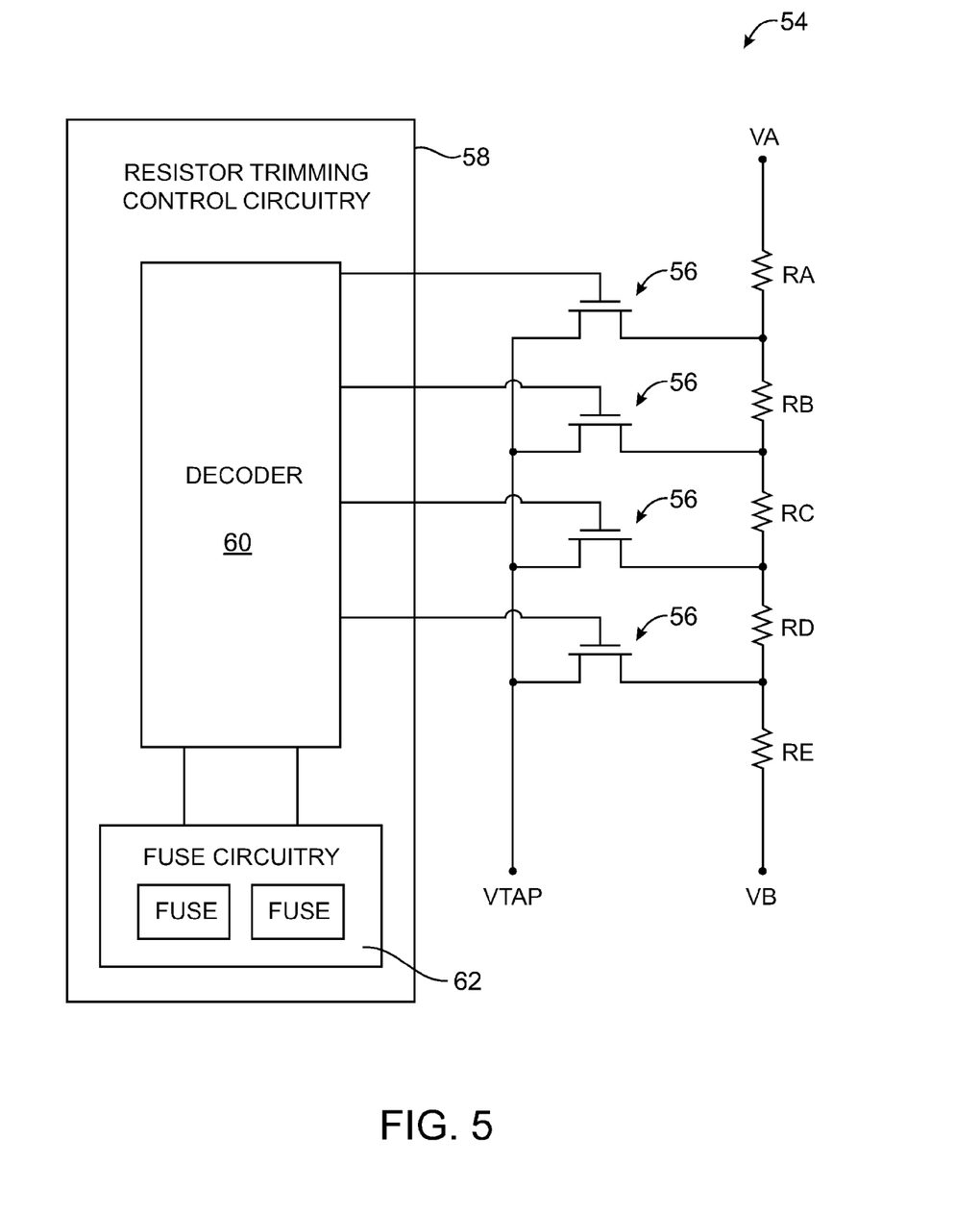
FIG. 5 is a schematic diagram of an illustrative trimmable resistor string of the type that may be used in adjusting voltage regulation circuitry such as the voltage regulation circuitry of FIG. 3 in accordance with an embodiment of the present invention.

The first and second resistor strings may each be formed using a configuration of the type shown in FIG. 5. FIG. 5 shows a trimmable resistor string 54. Resistor string 54 may have a string of resistors (e.g., RA-RE) connected in series between two terminals VA and VB. Five resistors are shown in this illustrative example, but more resistors or fewer resistors may be used if desired. The resistances of RA-RE may all be equal or different. An intermediate node may lie between each pair of connected resistors. Each intermediate node may be connected to the drain of a trimming pass transistor 56. Each pass transistor 56 may be an NMOS transistor. Pass transistors 56 may also be implemented using PMOS transistors if desired.

The gates of trimming pass transistors 56 may be coupled to a control circuit. The control circuit adjusts the resistance of the adjustable resistor circuitry of FIG. 5 by producing control signals that are applied to the gates of transistors 56. In the illustrative example of FIG. 5, the control signals are provided at the output of decoder 60 within resistor trimming control circuitry 58. During characterization operations, the behavior of circuitry 28 and the other circuitry of integrated circuit 10 may be characterized. For example, a testing tool may probe test circuits on integrated circuit 10 or control circuitry 58 may examine the voltage at node 52 to determine whether voltage VSSADDG is exhibiting a desired nominal value.

Based on these characterizing measurements or other suitable measurements on integrated circuit 10, appropriate trim adjustment settings for the trimmable resistors of voltage regulator circuitry 28 are computed. Fuse programming circuitry (e.g., on-chip circuitry and/or an external fuse programming tool) may program (blow) one or more appropriate fuses in fuse circuitry 62. The states of the fuses following fuse programming operations may serve as nonvolatile (e.g., one-time programmable) trim settings for the trimmable resistor circuitry of FIG. 5 (i.e., for the trimmable first and second resistor strings of circuitry 28). Fuse circuitry 62 may supply these trim settings to decoder 60. Decoder 60 may be, for example, a binary decoder that decodes logic signals from n fuse bits to produce $2^n$ control signals at its output. Decoder 60 may decode the trim settings and may provide corresponding trimming control signals to pass transistors 56. In a typical configuration, decoder 60 is configured to assert only one of its output lines, so that only one of the pass transistors 56 is turned on at a given time. The pass transistors that are off form open circuits and do not pass current. The pass transistor that is on serves to select a corresponding tap point on resistor string 54. The voltage of the tap point may be provided on terminal VTAP. When trimmable resistor circuitry 54 of FIG. 5 is being used to implement series-connected resistors R1 and R2 of FIG. 3, the voltage VTAP serves as voltage VREF. When trimmable resistor circuitry 54 of FIG. 5 is being used to implement series-connected resistors R1' and R2' of FIG. 3, the voltage VTAP serves as feedback voltage FBK. By adjusting both the first and second trimmable resistor strings in parallel so that they continue to match one another despite trim adjustments, fluctuations in the resistance of one of the strings (e.g., due to PVT variations) are tracked and canceled by fluctuations in the matching resistance of the other one of the strings. These types of trim adjustments may therefore be used to accurately adjust the voltage at node 52 to the desired voltage level of –0.15V.

As this example makes clear, decoder 60 may be controlled by fuse circuitry 62. In the example of FIG. 5, two fuses are being used to program the four outputs of decoder 60. More fuses may be used if a larger decoder is used (e.g., fuse circuitry 62 may have three fuses if decoder 60 has 8 outputs). Fuse circuitry 62 is typically programmed at a fabrication plant to trim voltage regulation circuitry 28 to ensure that the desired voltage is provided on node 52. Resistor trimming control circuitry 58 may incorporate other types of control circuitry if desired. Control circuitry 58 may, for example, include registers that are loaded using a scan chain, random-access-memory (RAM) bits such as configuration RAM bits in the memory array of cells 16, or any other suitable type of control elements for programming trimmable resistor string 54.

Once trimmable resistor string 54 has been programmed, VTAP may be coupled through one pass transistor 56 to a unique intermediate node. The group of series resistors that are above the unique intermediate node may collectively have a series resistance of RA', and the group of series resistors that are below the unique intermediate node may collective have a series resistance of RB'. For example, if the second pass transistor were enabled (e.g., the unique intermediate node is the node between resistor RB and RC), RA' would be equal to the sum of the resistances of resistors RA and RB, and RB' would be equal to the sum of the resistances of resistors RC-RE.

The first resistor string formed by R1 and R2 and the second resistor string formed by R1' and R2' may be implemented using trimmable resistor string 54 or any other suitable trimmable resistor circuitry. The first and second resistor strings may be adjusted in the same way by a common resistor trimming control circuitry 58 to ensure that the resistances remain matched after trimming. Matching resistances help ensure that the voltages at the positive and negative input of error amplifier 42 are matched as well. The resistor strings are preferably trimmed to ensure that the inputs to error amplifier 42 are at identical voltage levels when a desired value of VSSADDG is being produced at output 52 (e.g., a voltage of 0.5 V may be produced at each of the inputs of the error amplifier). If optimal tap points are selected, transistors in error amplifier 42 will operate correctly in saturation mode, thereby ensuring that the negative feedback function of circuitry 28 will operate as expected to provide the desired voltage of –0.15V at node 52.

Voltage regulation circuitry 28 may use matching resistor strings to address the problem of supply variation. Voltage VCC may exhibit fluctuations during operation of circuit 10. Because both resistor R1 and resistor R1' are coupled to VCC, the variation in VCC affects both the first and second resistor strings. This variation effectively cancels itself out from the perspective of error amplifier (e.g., any noise on VCC is reflected on both inputs of amplifier 42). The voltage regulation circuitry 28 therefore has inherent tolerance to voltage variation, allowing for supply noise to be rejected without the need for additional stable reference generation circuitry (e.g., without bandgap reference circuitry). The circuit block of FIG. 3 is self-contained (i.e., circuitry 28 does not require additional stable reference generation circuitry) and has inherent offset compensation because the negative feedback corrects for any offset.

To address errors arising from process variations, the first and second resistor strings can be fabricated symmetrically in close proximity to one another. This ensures that process fluctuations that affect one resistor string will tend to affect the other resistor string in the same way. The actual values of the resistances are generally not critical provided that the resistors are fabricated in appropriate ratios.

Resistors R3 and R4 need not be fixed. If desired, resistors R3 and R4 may be implemented using the trimmable resistor string configuration shown in FIG. 5. Resistors R3 and R4 may not be matched to the resistances of R1 and R2 respectively. The resistance values of resistors R3 and R4 should be chosen to obtain the desired voltage of –0.15 V at node N1 (in the present example). Resistors R3 and R4 need not use the same type of resistor trimming control circuitry 58 as the resistor trimming circuitry used for the first and second resistor strings.

Figure 6:
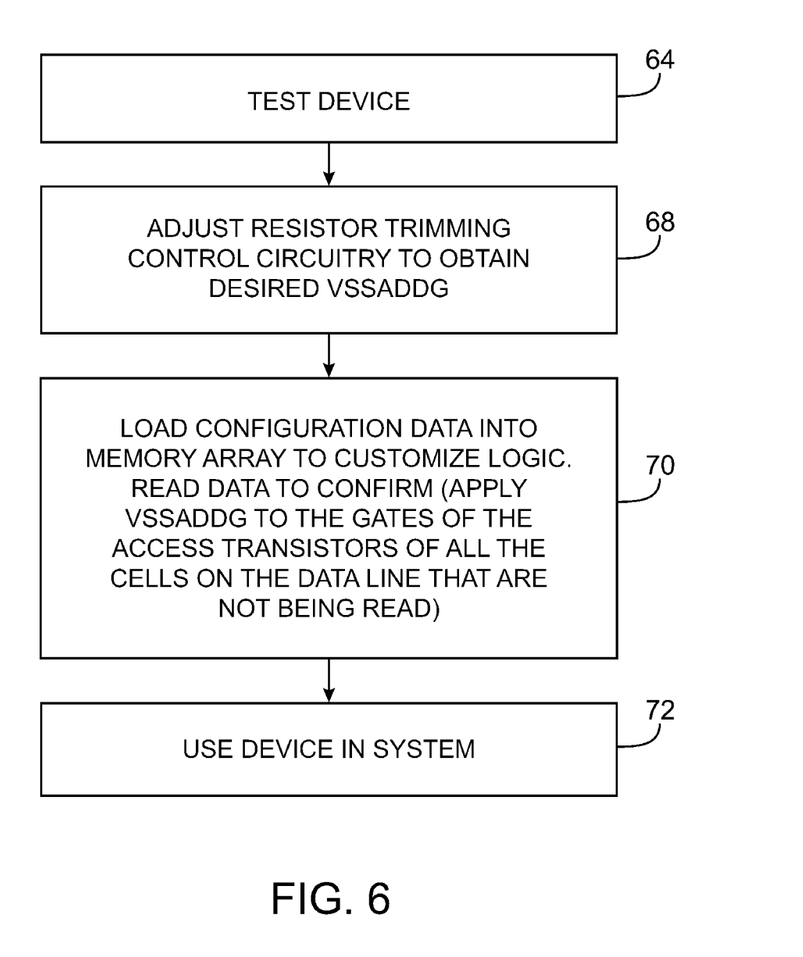
FIG. 6 is a flow chart of illustrative steps involved in adjusting trimmable resistor circuits in a voltage regulator and in configuring programmable logic on an integrated circuit of the type shown in FIG. 1 in accordance with an embodiment of the present invention.

The voltage regulation circuitry 28 may be used to reduce leakage current in metal-oxide-semiconductor transistors. FIG. 6 shows a flow chart of illustrative steps involved in programming an integrated circuit such as a programmable integrated circuit (e.g., a programmable logic device integrated circuit).

Integrated circuit 10 may be fabricated at a fabrication plant using complementary metal-oxide-semiconductor (CMOS) technology. Upon completion, integrated circuit 10 may be tested using a testing tool (step 64). The testing tool may probe the wafer that integrated circuit 10 is fabricated on to measure certain voltages or integrated circuit 10 may be tested after packaging. For example, the test device may probe node 52 or an associated node to measure VSSADDG.

Based on the measured value of VSSADDG, the testing tool or other circuitry or equipment may determine appropriate adjustments to make to the trimmable resistor strings. Fuse programming equipment may then be used to blow appropriate fuses on integrated circuit 10 to store the trim settings. The fuses may be programmed electrically, using lasers, using on-chip circuitry, using external circuitry, or using any other suitable programming technique (step 68). After trimming, the voltage value at the positive and negative inputs of error amplifier 42 should be approximately 0.5 V (e.g., common-mode input level of 0.5 V) and node 52 should exhibit have a desired VSSADDG of −0.15 V when powered (in the present example). By using voltage regulation circuitry 28 to produce VSSADDG, VSSADDG may be accurate and may tolerate PVT variations. Voltage VSSADDG may be fed to the address and data control circuitry 14.

The address and data control circuitry 14 may load configuration data into the memory array to customize logic (step 70). Data may be written into the memory array through address transistors 38 sequentially by enabling corresponding address lines 18.

Following the loading of a desired set of configuration data into the memory array, address and data control circuitry 14 may proceed to read data from the memory array to confirm that data has been loaded successfully. Control circuitry 14 may enable a corresponding address line 18 and data line 22 to select an individual memory cell 16. Data may be read using the differential scheme described above if desired. During reading, VSSADDG may be provided on the gates of all the other address lines 18 to help reduce leakage from the other memory cells connected to the corresponding data line 22. Because VSSADDG is well controlled, the disabled address transistors 38 may have gate-to-source voltages that do not exceed 1.65 V and that therefore do not suffer from possible reliability issues (e.g., dielectric gate breakdown). The reduction of leakage may allow a relatively large number of memory cells to be placed on the data line while ensuring that the address and data control circuitry 14 will be able to read data correctly from the memory array. The ability to read data more accurately may result in higher yield for integrated circuits 10.

Once the address and data control circuitry 14 has confirmed that correct data has been loaded into the memory array, the memory array may be used as a configuration memory array. The configuration memory array may store static control bits used to program customizable logic. The static control bits may be used to customize any suitable programmable integrated circuits. The static control bits may be used to produce any logic function supported by the circuitry of integrated circuit 10. The static control bits may be fed to the gates of programmable pass transistors. The pass transistors may route signals on integrated circuit 10 that implement a desired logic function.

Once the memory array has been loaded with configuration data to program circuit 10 to implement a custom logic design, integrated circuit 10 may be used in a system (step 72).

The foregoing is merely illustrative of the principles of this invention and various modifications can be made by those skilled in the art without departing from the scope and spirit of the invention.

What is claimed is:

1. Voltage regulation circuitry, comprising:
   an error amplifier that has first and second inputs and an amplifier output;
   a first resistor string coupled to the first input of the error amplifier;
   a second resistor string coupled to the second input of the error amplifier, wherein the first and second resistor strings have matching resistances;
   a third resistor string that has an intermediate node coupled to the second resistor string; and
   a transistor that has a gate terminal coupled to the amplifier output and that has a source-drain terminal coupled to the first resistor string, wherein each of the first and second resistor strings comprises a trimmable resistor circuit.

2. The voltage regulation circuitry defined in claim 1, wherein the transistor comprises an n-channel transistor.

3. The voltage regulation circuitry defined in claim 1, wherein the third resistor string comprises another trimmable resistor circuit.

4. The voltage regulation circuitry defined in claim 1, further comprising an output terminal coupled to the transistor and the first resistor string, wherein the output terminal supplies a regulated output voltage to a gate of another transistor to reduce leakage currents.

5. The voltage regulation circuitry defined in claim 1, wherein the first resistor string comprises a first plurality of series-connected resistors, wherein the second resistor string comprises a second plurality of series-connected resistors, wherein the first plurality of series-connected resistors has a first tap point that provides a feedback signal to the first input of the error amplifier, and wherein the second plurality of series-connected resistors has a second tap point that provides a reference signal to the second input of the error amplifier.

6. Voltage regulation circuitry, comprising:
   an error amplifier that has first and second inputs and an amplifier output;
   a first resistor string coupled to the first input;
   a second resistor string coupled to the second input, wherein the first and second resistor strings have matching resistances;
   a third resistor string that has an intermediate node coupled to the second resistor string, wherein the first, second, and third resistor strings comprise at least one trimmable resistor circuit, and wherein the at least one trimmable resistor circuit comprises:
      a plurality of resistors;
      a plurality of pass transistors coupled to the plurality of resistors, wherein the pass transistors each have a gate terminal; and
      fuse-based control circuitry that controls the pass transistors to adjust the at least one trimmable resistor circuit.

7. The voltage regulation circuitry defined in claim 6, wherein the plurality of resistors are coupled in series, wherein each pass transistor in the plurality of pass transistors is coupled to a respective tap point formed between a respective pair of the resistors in the plurality of resistors, and wherein the fuse-based control circuitry further comprises a decoder having control terminals connected to the gate terminals of the pass transistors.

8. Voltage regulation circuitry, comprising:
   an error amplifier that has first and second inputs and an amplifier output;
   a first resistor string coupled to the first input;
   a second resistor string coupled to the second input, wherein the first and second resistor strings have matching resistances;

a transistor that has a gate terminal coupled to the error amplifier output and that has a source-drain terminal coupled to the first resistor string;

a positive power supply terminal that receives a positive power supply voltage; and a negative supply terminal that receives a negative supply voltage from a charge pump, wherein the first resistor string and the transistor are coupled between the positive power supply terminal and the negative supply terminal and wherein the second resistor string is coupled between the positive power supply and the negative supply terminal.

9. Circuitry, comprising:

an array of volatile memory cells having associated address transistors with gates;

voltage regulation circuitry that supplies a negative voltage; and address and data control circuitry that selectively applies the negative voltage to at least some of the gates to reduce leakage currents, wherein the voltage regulation circuitry includes an error amplifier with first and second inputs, a first resistor string connected to the first input, and a second resistor string connected to the second input, wherein the first and second resistor strings have matching resistances, wherein the first resistor string includes first and second resistors, and wherein the second resistor in the first resistor string has a first terminal that is coupled to the first resistor and a second terminal on which the negative voltage is applied.

10. The circuitry defined in claim 9, wherein the first and second resistor strings comprise at least one fuse-based trimmable resistor circuit that adjusts the negative voltage.

11. The circuitry defined in claim 9, wherein the voltage regulation circuitry further comprises a transistor connected to the first resistor string and the error amplifier.

12. The circuitry defined in claim 11, wherein the first resistor string comprises a plurality of resistors and a plurality of pass transistors that select a tap point for the first resistors string and wherein the circuitry further comprises a feedback path that connects the tap point of the first resistor string to the first input.

13. The circuitry defined in claim 12, wherein second resistor string comprises a plurality of resistors and a plurality of pass transistors that select a tap point for the second resistors string, wherein the circuitry further comprises a path that connects the tap point of the second resistor string to the second input.

14. A method of using first and second resistor strings, wherein the first resistor string is formed from a first plurality of resistors and has a first tap point between a first pair of resistors in the first plurality of resistors, and wherein the second resistor string is from a second plurality of resistors and has a second tap point between a second pair of resistors in the second plurality of resistors, the method comprising:

providing a reference voltage from the first tap point to a first input of an error amplifier over a line that couples the first tap point to the first input;

providing a feedback signal from the second tap point to a second input of the error amplifier over a feedback path that couples the second tap point to the second input;

providing a control signal at an output of the error amplifier to a gate of a transistor, wherein the transistor and the second plurality of resistors are coupled in series between a negative supply terminal that receives a negative supply voltage and a power supply terminal that receives a voltage that is greater than the negative supply voltage; and with control circuitry, providing static control signals to the first and second resistor strings via pass gates to trim the first and second resistor strings.

15. The method defined in claim 14, wherein the first and second resistor strings are coupled to a terminal, the method comprising:

applying a positive power supply voltage to the terminal.

16. The method defined in claim 14, wherein the control circuitry comprises fuse-based control circuitry, and wherein providing the static control signals to trim the first and second resistor strings comprises generating the static control signals using the fuse-based control circuitry.

\* \* \* \* \*